United States Patent
Park et al.

(10) Patent No.: US 8,247,316 B2
(45) Date of Patent: Aug. 21, 2012

(54) METHOD FOR FABRICATING A TRANSISTOR INCLUDING A POLYSILICON LAYER FORMED USING TWO ANNEALING PROCESSES

(75) Inventors: Byoungkeon Park, Yongin-si (KR); Taehoon Yang, Yongin-si (KR); Jinwook Seo, Yongin-si (KR); Seihwan Jung, Yongin-si (KR); Kiyong Lee, Yongin-si (KR); Maxim Lisachenko, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 63 days.

(21) Appl. No.: 12/779,377

(22) Filed: May 13, 2010

(65) Prior Publication Data
US 2010/0219415 A1    Sep. 2, 2010

Related U.S. Application Data

(62) Division of application No. 11/964,239, filed on Dec. 26, 2007, now abandoned.

(30) Foreign Application Priority Data

Dec. 29, 2006    (KR) ................ 2006-138322

(51) Int. Cl.
*H01L 21/20* (2006.01)
*H01L 21/36* (2006.01)
(52) U.S. Cl. .... 438/486; 438/166; 257/75; 257/E21.412
(58) Field of Classification Search .......... None
See application file for complete search history.

(56) References Cited

U.S. PATENT DOCUMENTS

| 6,084,247 | A | 7/2000 | Yamazaki et al. |
| 6,162,667 | A | 12/2000 | Funai et al. |
| 6,346,437 | B1 * | 2/2002 | Maekawa et al. ............ 438/166 |
| 7,452,790 | B2 * | 11/2008 | Park et al. .................... 438/486 |
| 7,608,869 | B2 | 10/2009 | Yang et al. |
| 2004/0121529 | A1 | 6/2004 | Sohn et al. |
| 2005/0083461 | A1 | 4/2005 | Yang et al. |

(Continued)

FOREIGN PATENT DOCUMENTS

| EP | 1 612 852 | 1/2006 |
| EP | 1 858 072 | 11/2007 |
| KR | 10-2006-0015196 | 2/2006 |
| KR | 10-2006-0057444 | 5/2006 |
| WO | WO 2004/042805 | 5/2004 |

OTHER PUBLICATIONS

U.S. Appl. No. 11/964,239, filed Dec. 26, 2007, Byoungkeon Park et al., Samsung SDI Co., Ltd.

*Primary Examiner* — Evan Pert
*Assistant Examiner* — Andres Munoz
(74) *Attorney, Agent, or Firm* — H.C. Park & Associates, PLC (57) ABSTRACT

A transistor includes a substrate, an active region including a source region, a channel region, and a drain region which are crystallized using an SGS crystallization method and are formed on the substrate so that a grain size of a first annealed portion and a second annealed portion are different from each other, a gate insulating layer formed on the active region, and a gate electrode formed on the gate insulating layer.

18 Claims, 5 Drawing Sheets

U.S. PATENT DOCUMENTS

| | | |
|---|---|---|
| 2006/0003503 A1 | 1/2006 | Yang et al. |
| 2006/0030085 A1 | 2/2006 | Park et al. |
| 2006/0033107 A1 * | 2/2006 | Lee et al. ......... 257/66 |
| 2006/0040429 A1 | 2/2006 | Park et al. |
| 2006/0073648 A1 | 4/2006 | Park et al. |
| 2006/0121651 A1 | 6/2006 | Park et al. |

* cited by examiner

METHOD FOR FABRICATING A TRANSISTOR INCLUDING A POLYSILICON LAYER FORMED USING TWO ANNEALING PROCESSES

CROSS-REFERENCE TO RELATED APPLICATION

This application is a divisional of U.S. patent application Ser. No. 11/964,239, filed in the U.S. Patent and Trademark Office on Dec. 26, 2007, now abandoned, and claims priority from Korean Application No. 2006-138322 filed on Dec. 29, 2006, in the Korean Intellectual Property Office, the disclosure of which is incorporated herein by reference.

BACKGROUND OF THE INVENTION

1. Field of the Invention

Aspects of the present invention relate to a transistor, a fabricating method thereof, and a flat panel display device therewith. More particularly, aspects of the present invention relate to a transistor, a fabricating method, and a flat panel display device, wherein an amorphous silicon layer formed on an insulating substrate is crystallized into a polycrystalline silicon layer using an SGS (Super Grain Silicon) crystallization method, whereby the substrate undergoes a first annealing process by absorbing or diffusing an extremely small amount of metal catalysts into a capping layer as the substrate undergoes a first heat treatment in order to control the concentration of the metal catalyst left in the polycrystalline silicon layer, then the substrate undergoes a second annealing process, that is, a remaining crystallization as the substrate undergoes a second heat treatment after the capping layer and the metal catalyst layer are removed.

2. Description of the Related Art

In general, a thin film transistor (TFT) is a semiconductor device wherein a channel region, where a hole or an electron can flow, can be formed by doping a P-type or an N-type dopant on a source region and a drain region, and then applying a predetermined voltage to a gate electrode. The thin film transistor can be classified into a PMOS (P-type metal-oxide semiconductor) transistor and an NMOS (N-type metal-oxide semiconductor) transistor. If the source region and the drain region are doped with the P-type dopant, and the hole flows when a channel region is formed, the transistor is called the PMOS transistor. On the contrary, if the source region and the drain region are doped with the N-type dopant, and the electron flows when a channel region is formed, the transistor is called the NMOS transistor.

The thin film transistor is used widely as a switching transistor or a driving transistor of a variety of flat panel display devices, such as an active matrix liquid crystal display device and an organic light emitting diode display device. In general, in the thin film transistor as described above, amorphous silicon is deposited on a substrate made of glass, quartz, plastic or steel. Then, a semiconductor layer is formed by crystallizing the amorphous silicon after the amorphous silicon is dehydrogenated. Specifically, the semiconductor layer is formed by depositing an amorphous silicon layer on the substrate using a chemical vapor deposition method, and processed to include a source region, a drain region and a channel region (referred to as an active region as a whole).

However, if the amorphous silicon is deposited directly on a substrate by the chemical vapor deposition method and the like, the amorphous silicon layer containing about 12% of hydrogen is formed, which has low electron mobility. In addition, if the amorphous silicon layer of low electron mobility is crystallized into a silicon layer with a crystalline structure having high electron mobility, the silicon layer can be damaged by an explosion of the hydrogen contained therein. Accordingly, a dehydrogenation process is executed in order to prevent the explosion of the hydrogen during the course of the crystallization process.

In general, an amorphous silicon layer is dehydrogenated by heat-treating the amorphous silicon layer for dozens of minutes to a few hours at temperatures over 400° C. in a furnace. Subsequently, a crystallization process to crystallize the dehydrogenated amorphous silicon layer is carried out.

A few methods used to crystallize the amorphous silicon into polycrystalline silicon include solid phase crystallization, excimer laser crystallization, metal induced crystallization, and metal induced lateral crystallization. The solid phase crystallization is a method wherein an amorphous silicon layer is annealed for a few hours to dozens of hours below about 700° C. 700° C. is a deflection temperature of glass which forms a substrate of a display device to which a thin film transistor is applied. An excimer laser crystallization is a method wherein an amorphous silicon layer is heated locally to a high temperature by injecting a light beam from an excimer laser into the amorphous silicon layer so that the amorphous silicon layer is crystallized.

A metal induced crystallization is a method wherein a metal such as nickel, palladium, gold, aluminum, and so on, is brought into contact with an amorphous silicon layer or injected into the amorphous silicon layer. Consequently, a phase transition is induced during which the amorphous silicon changes into polycrystalline silicon. A metal induced lateral crystallization is a method wherein silicide generated from the reaction of a metal and silicon continuously propagates laterally. Consequently, metal induced lateral crystallization induces the crystallization of an amorphous silicon layer in sequence.

However, the solid phase crystallization has disadvantages in that the process time is too long, and the substrate can be deformed easily due to the high temperature heat treatment occurring over a long time. The excimer laser crystallization has disadvantages in that the process requires an expensive laser device, and the interfacial property between a semiconductor layer and a gate insulating layer is poor because extrusions are generated on a polycrystallized surface. The metal induced crystallization or the metal induced lateral crystallization have disadvantages in that a leak (or leakage) current of a semiconductor layer of a thin film transistor increases because metal catalysts are left in the polycrystalline silicon layer. Consequently, the characteristics of various flat panel display devices using the silicon layer as a switching transistor or a driving transistor of the above processes are poor.

SUMMARY OF THE INVENTION

Aspects of the present invention are directed to controlling the concentration of the metal catalyst left in a polycrystalline silicon layer when an amorphous silicon layer formed on an insulating substrate is crystallized into a polycrystalline silicon layer using an SGS (Super Grain Silicon) crystallization method.

An aspect of the present invention is to provide a transistor, a fabricating method, and a flat panel display device, wherein a substrate is crystallized by absorbing or diffusing an extremely small amount of metal catalysts into a capping layer as the substrate undergoes a first heat treatment. Subsequently, the substrate undergoes a remaining (or further) crystallization as the substrate undergoes a second heat treatment after the capping layer and the metal catalyst are removed.

Accordingly, a leak (or leakage) current can be minimized because the concentration of the metal catalyst left in the polycrystalline silicon layer can be minimized.

A transistor according to an aspect of the present invention minimizes a leak (or leakage) current can include a substrate; an active region including a source region, a channel region, and a drain region which are crystallized using an SGS (Super Grain Silicon) crystallization method and are formed on the substrate so that a crystal grain size of a first annealed portion and a second annealed portion are different from each other; a gate insulating layer formed on the active region; and a gate electrode formed on the gate insulating layer.

According to aspects of the present invention, a grain boundary size of the first annealed portion can be smaller than that of the second annealed portion. The concentration of metal catalysts of the first annealed portion can be higher than that of the second annealed portion. The source region and the drain region of the active region can be doped with either a P-type dopant or an N-type dopant. The gate electrode can be one of MoW, Ti, Cu, AlNd, Al, Cr, Mo alloy, Cu alloy, Al alloy, or any combinations thereof. The transistor can also include a buffer layer formed between the substrate and the active region. The metal catalyst can be one of Ni, Pd, Ti, Ag, Au, Al, Sn, Sb, Cu, Co, Mo, Tr, Ru, Rh, Cd, Pt, or any combination thereof.

The transistor according to an aspect of the present invention can also include an inter-layer dielectric layer formed on a surface of the gate insulating layer and the gate electrode, a source electrode connected to the source region and penetrating through the inter-layer dielectric layer and the gate insulating firm, and a drain electrode connected to the drain region and penetrating through the inter-layer dielectric layer and the gate insulating layer.

A fabricating method of the transistor according to an aspect of the present invention includes preparing a substrate; forming an amorphous silicon layer on the substrate; forming a capping layer on the amorphous silicon layer; forming a metal catalyst layer on the capping layer; performing a first annealing process to crystallize amorphous silicon of the amorphous silicon layer into first annealed polycrystalline silicon using an SGS (Super Grain Silicon) crystallization method wherein metal catalysts of the metal catalyst layer diffuse as far as the amorphous silicon by penetrating through the capping layer; removing the metal catalyst layer and the capping layer; and performing a second annealing process wherein the metal catalyst crystallizes the amorphous silicon into second annealed polycrystalline silicon using an SGS crystallization method to form a polycrystalline silicon layer.

In aspects of the present invention, after the second annealing process, the method can include forming a semiconductor layer (an active region) by patterning the polycrystalline silicon layer and forming a gate insulating layer, a gate electrode, an inter-layer dielectric layer, and a source/drain electrode on the substrate. During removing of the metal catalyst layer and the capping layer, the metal catalyst layer and the capping layer may be removed once the size of the respective grain boundary size is smaller than half of an average distance between the metal catalysts as the amorphous silicon is crystallized.

In aspects of the present invention, the method can also include forming a buffer layer prior to the forming of the amorphous silicon layer on the substrate. The crystallinity of the polycrystalline silicon formed by the first annealing process is different from that of the polycrystalline silicon formed by the second annealing process. A grain boundary size of the polycrystalline silicon formed by the first annealing process is smaller than that of the polycrystalline silicon formed by the second annealing process.

According to aspects of the present invention, the concentration of the metal catalyst of the polycrystalline silicon formed by the second annealing process is lower than that of the metal catalyst of the polycrystalline silicon formed by the first annealing process. The metal catalyst layer can be one of Ni, Pd, Ti, Ag, Au, Al, Sn, Sb, Cu, Co, Mo, Tr, Ru, Rh, Cd, Pt, or any combinations thereof. The capping layer can be an insulating layer and be one of an oxide film, a nitride film, or any combinations thereof. The oxide film can be one of silicon dioxide ($SiO_2$), aluminum oxide (alumina, $Al_2O_3$), hafnium oxide ($HfO_2$) and zirconium oxide (zirconia, $ZrO_2$).

As described above, in aspects of the present invention, a leak (or leakage) current can be reduced by minimizing the concentration of the metal catalyst that is unnecessarily left in a polycrystalline silicon layer. In addition, a polycrystalline silicon layer of excellent (or improved) crystallinity can be obtained by reducing unnecessary crystallization by remaining metal catalysts.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the aspects, taken in conjunction with the accompanying drawings of which.

DETAILED DESCRIPTION OF THE EMBODIMENTS

Reference will now be made in detail to aspects of the present invention, examples of which are illustrated in the accompanying drawings, wherein like reference numerals refer to the like elements throughout. The aspects are described below in order to explain the present invention by referring to the figures.

Figure 1A:
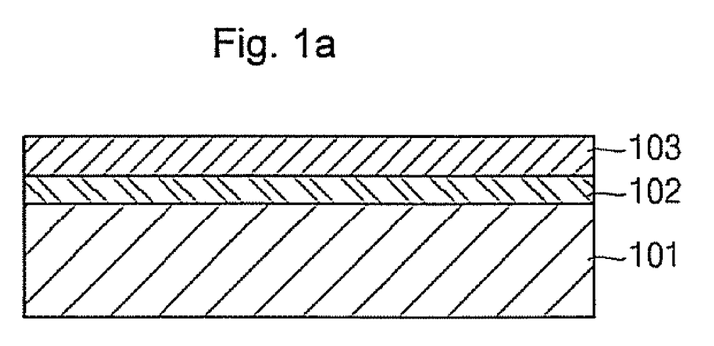
FIGS. 1A to 1F are cross-sectional views depicting a fabricating process wherein an amorphous silicon layer is crystallized into a polycrystalline silicon layer using an SGS (Super Grain Silicon) crystallization method according to an aspect of the present invention.

FIGS. 1A to 1F are cross-sectional views depicting a fabricating process wherein an amorphous silicon layer is crystallized into a polycrystalline silicon layer using an SGS (Super Grain Silicon) crystallization method according to an aspect the present invention. First, FIG. 1A is a cross-sectional view depicting a process during which a buffer layer 102 is formed on a substrate 101, and an amorphous silicon layer 103 is formed on the buffer layer 102. As shown in FIG. 1A, the buffer layer 102 is formed as a single layer or a double layer of a silicon oxide layer or a silicon nitride layer by use of a chemical vapor deposition technique or process or a physical vapor deposition technique or process on the substrate 101. In various aspects, the substrate 101 is made of plastic, glass or steel. As shown, the buffer layer 102 prevents (or reduces) the diffusion of water or impurities generated from the bottom substrate 101. The buffer layer 102 also controls the velocity of heat transfer so that a semiconductor layer can be crystallized properly.

Subsequently, the amorphous silicon layer 103 is formed on the buffer layer 102. In the aspect shown, the amorphous silicon layer 103 is formed by the chemical vapor deposition technique in general, though not required. The amorphous silicon layer 103 formed by the chemical vapor deposition technique contains gases such as hydrogen, and the gases cause problems such as a decrease in mobility of electrons, and so on. Accordingly, a dehydrogenation process is executed (or performed) so that hydrogen is not left in (or is removed from) the amorphous silicon layer 103.

Figure 1B:
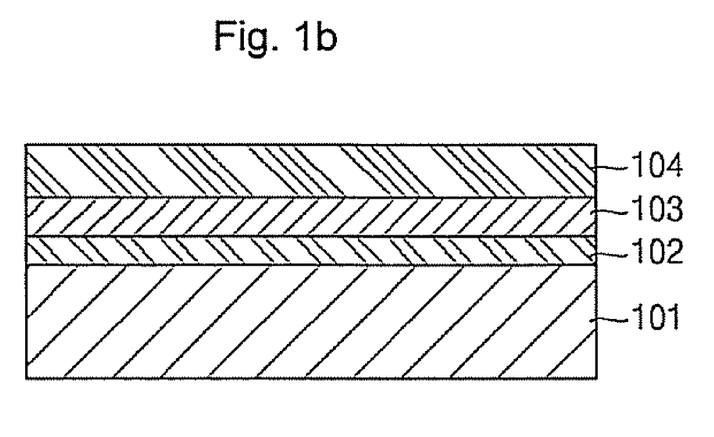

FIG. 1B is a cross-sectional view depicting a process during which a capping layer 104 is formed on the substrate 101. As shown in FIG. 1B, the capping layer 104 is formed on the substrate 101 on which the amorphous silicon layer 103 is formed. As shown, the capping layer 104 is formed of an oxide film or a nitride film by the chemical vapor deposition technique. The oxide film is made of a material such as silicon dioxide ($SiO_2$), aluminum oxide (such as alumina, $Al_2O_3$), hafnium oxide (such as $HfO_2$), and zirconium oxide (such as zirconia, $ZrO_2$), and the nitride film is made of a material such as silicon nitride (such as SiNx). In other aspects, the capping layer 104 may be any combinations of the oxide or nitride films.

As shown, the characteristics of the capping layer 104 can be changed by a variety of processing conditions during the course of the chemical vapor deposition process, and such characteristics change of the capping layer 104 can influence the diffusion or the infiltration of metal catalysts during the course of subsequent processes and the crystallization of the amorphous silicon layer 103 significantly. That is, when the capping layer 104 is formed by the chemical vapor deposition process, the characteristics of the capping layer 104 can be changed by changes in key variables such as an amount of silane gas, and/or an amount and power (or pressure) of ammonia gas.

As shown, the capping layer 104 is defined as an insulating layer which contributes to the crystallization of the amorphous silicon layer 103. The capping layer 104 controls the concentration or the amount of the metal catalyst by controlling the diffusion and the infiltration of the metal catalyst during the course of one or more heat treatment processes. The capping layer 104 can be made of an oxide such as silicon dioxide ($SiO_2$), aluminum oxide (such as alumina, $Al_2O_3$), hafnium oxide (such as $HfO_2$), zirconium oxide (such as zirconia, $ZrO_2$), or a nitride such as silicon nitride (SiNx), or any combinations thereof.

Figure 1C:
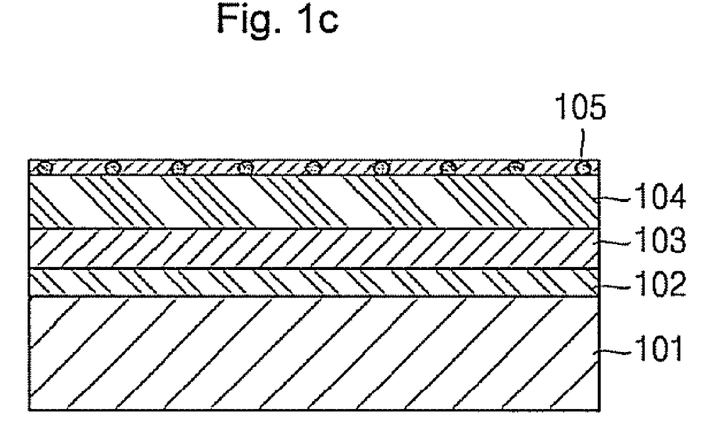

FIG. 1C is a cross-sectional view depicting a process during which a metal catalyst layer 105 is formed on the capping layer 104. As shown in FIG. 1C, the metal catalyst layer 105 is formed by depositing metal catalysts on the capping layer 104. As shown, the metal catalyst layer 105 is formed by depositing one, or more than one metal catalysts of Ni, Pd, Ti, Ag, Au, Al, Sn, Sb, Cu, Co, Mo, Tr, Ru, Rh, Cd, Pt, or any combinations thereof. It is preferable, but not required, to form the metal catalyst layer 105 with Ni because Ni can crystallize the amorphous silicon layer 103 into a polycrystalline silicon layer 110 more easily.

Figure 1D:
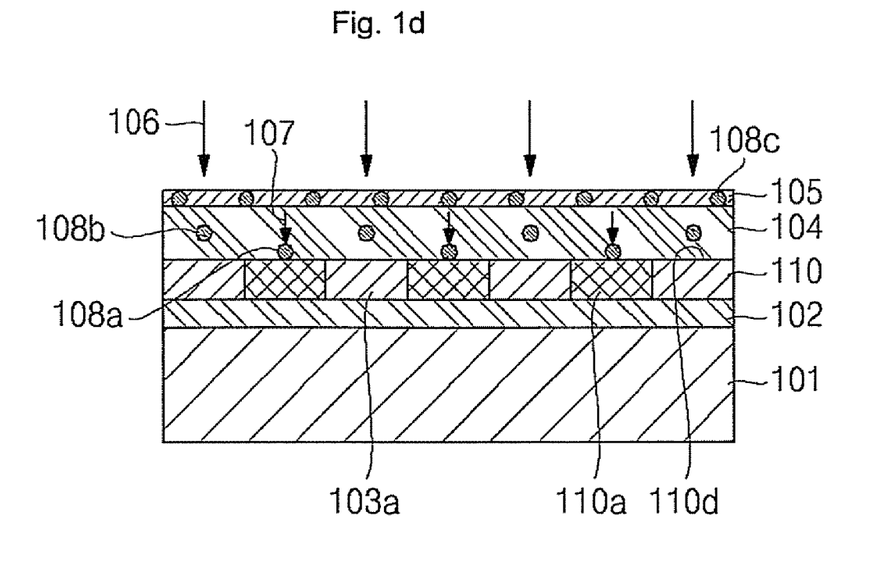

FIG. 1D is a cross-sectional view depicting a process during which metal catalysts 108c are absorbed or diffused into the capping layer 104 by carrying out of a first annealing process (depicted as) 106 while the substrate 101 undergoes a first heat treatment.

Subsequently, a process during which the amorphous silicon layer 103 is crystallized as the substrate 101 undergoes the first annealing process 106, is carried out. During the first annealing process 106, the metal catalyst 108c contained in the metal catalyst layer 105 diffuses or infiltrates (depicted as) 107 into the capping layer 104, and moves to an interface 104a between the capping layer 104 and the amorphous silicon layer 103 (shown in FIG. 1C). Consequently, a crystallization seed 108a is formed. As shown, metal catalysts 108b, which cannot reach the amorphous silicon layer 103, do not influence the crystallization of the amorphous silicon layer 103 at all. Preferably, the temperature for the heat treatment during the first annealing process 106 is 500° C. to 650° C., though not required. If the substrate 101 is heat-treated below 500° C., the crystallization cannot be accomplished as properly (or efficiently). On the contrary, in case that the substrate is heat-treated over 650° C., a seed 108a cannot be formed (or dispersed) as uniformly.

As shown, during the first annealing process 106, the metal catalyst 108c moves to the interface 104a between the amorphous silicon layer 103 and the capping layer 104 as the substrate 101 undergoes the first heat treatment. Subsequently, the crystallization seed (or the seed) 108a is formed. The amorphous silicon layer 103 is crystallized into a grain 110a of a polycrystalline silicon layer 110 using the seed 108a by adopting the SGS (Super Grain Silicon) crystallization method.

Figure 1E:
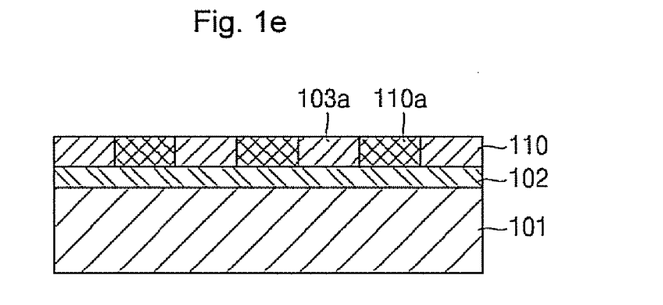

FIG. 1E is a cross-sectional view depicting a process during which a polycrystalline silicon layer 110 having low concentration of a remaining metal catalyst 108c is formed by removing the metal catalyst layer 105 and the capping layer 104. As shown in FIG. 1E, the polycrystalline silicon layer 110 having low concentration of the remaining metal catalyst 108c is formed by removing the capping layer 104. When the capping layer 104 is removed, the seed 108a formed at the interface 104a between the capping layer 104 and the polycrystalline silicon layer 110 should be removed together in order to form an immaculate (or a clean) interface 104a.

As shown, a time when the metal catalyst layer 105 and the capping layer 104 should be removed is calculated by the following equation 1.

$$V * t < \frac{L}{2} \quad \text{[Formula 1]}$$

Here, V is the average crystallization velocity, L is the distance between the seeds 108a, and t is the crystallization time.

That is, it is preferable, but not required, to remove the metal catalyst layer 105 and the capping layer 104 when a respective grain 110a distance (shown in FIG. 1F) is smaller than half of the average distance between the metal catalysts after the amorphous silicon layer 103 is crystallized.

For instance, if the grain boundary 110c grows at the rate of 0.83 μm per minute at 600° C., and the distance between the metal catalysts is 20 μm, $$t < \frac{20 \mu m}{2} \frac{1}{0.83 \mu m / min} \quad t < 12.05 min \quad \text{[Formula 2]}$$

That is, it is preferable, but not required, to remove the metal catalyst layer 105 and the capping layer 104 after the substrate 101 undergoes the first heat treatment for about 12 minutes, in this example.

Figure 1F:
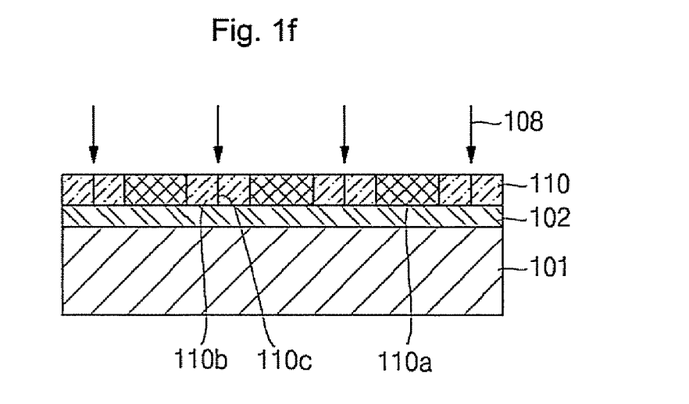

FIG. 1F is a drawing depicting a process during which a remaining amorphous silicon layer 103a is crystallized as the substrate 101 undergoes a second annealing process (depicted as) 108 while the substrate 101 undergoes a second heat treatment. During the second annealing process 108, the amorphous silicon layer 103 is crystallized beginning with (or starting at) the polycrystalline silicon layer grain 110a formed after the first annealing process 106.

One grain 110a of polycrystalline silicon layer 110 grows from one seed 108a formed by the metal catalyst 108c, and when the grains which grow from a plurality of different seeds (such as 108a) come in contact with one another, the grain boundary 110c is formed. Therefore, if the amount of the metal catalysts 108c which reaches the interface 104a is controlled properly (that is, after the first annealing process 106, the diffusion of the metal catalyst 108c is controlled by removing the unnecessary metal catalysts 108c and the capping layer 104, consequently, the number of the seed 108a for grain growth at the interface 104a can be controlled), the grain 110a of the polycrystalline silicon layer 110 becomes larger, and the number of the grain boundary 110c becomes smaller. Preferably, though not required, the temperature for the second annealing process 108 is 550° C. to 800° C. If the substrate 101 is heat-treated below 550° C., the crystallization cannot be accomplished as properly (or efficiently). On the contrary, in case that the substrate is heat-treated over 800° C., the substrate can be deformed.

As shown, during the second annealing process 108, the remaining amorphous silicon layer 103a is crystallized into the polycrystalline silicon layer 110 formed after the first annealing process 106 (using the SGS (Super Grain Silicon) crystallization method) as the substrate 101 undergoes the second annealing process 108.

In the polycrystalline silicon layer 110 formed by the SGS crystallization method, the diffusion of the metal catalyst 108c is controlled by removing the unnecessary metal catalyst 108c and the capping layer 104 after the first annealing process 106. Therefore, the second annealing process 108 is carried out when the number of the seed 108a for grain growth at the interface 104a is controlled or removed. Consequently, the grain 110a of the polycrystalline silicon layer 110 becomes larger, and the number of the grain boundary 110c becomes smaller.

Figure 2:
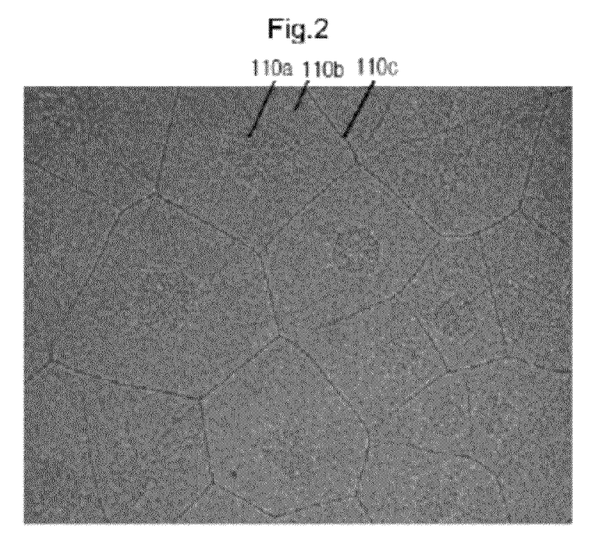
FIG. 2 is a cross-sectional view depicting a polycrystalline silicon layer formed according to an aspect the present invention after the polycrystalline silicon layer is etched lightly.

FIG. 2 is a microscopic image depicting the polycrystalline silicon layer 110 formed using the SGS crystallization method according to aspects of the present invention after the polycrystalline silicon layer 110 is etched lightly. In the case of the polycrystalline silicon portion 110b formed by the second annealing process 108, the concentration of the metal catalyst 108c is lower, or the crystallinity is better than when the polycrystalline silicon portion (or grain) 110c formed by the first annealing process 106. This is because the diffusion and infiltration of the unnecessary metal catalyst 108c is reduced as the metal catalyst layer 105 and the capping layer 104 are removed after the first annealing process 106. As the amount of unnecessary metal catalyst 108c is reduced, the crystallinity becomes excellent (or improved) because the grain (such as 110a) can be formed uniformly. In various aspects, the first heat treatment may nucleate and/or grow the grain 110a and the subsequent second heat treatment further grows the grain 110a into a larger grain 110b, which includes grain 110a. In other aspects, further independent nucleation of grains is prevented or minimized during the second heat treatment so that the grain 110a simply grows into the larger grain 110b.

Figure 3:
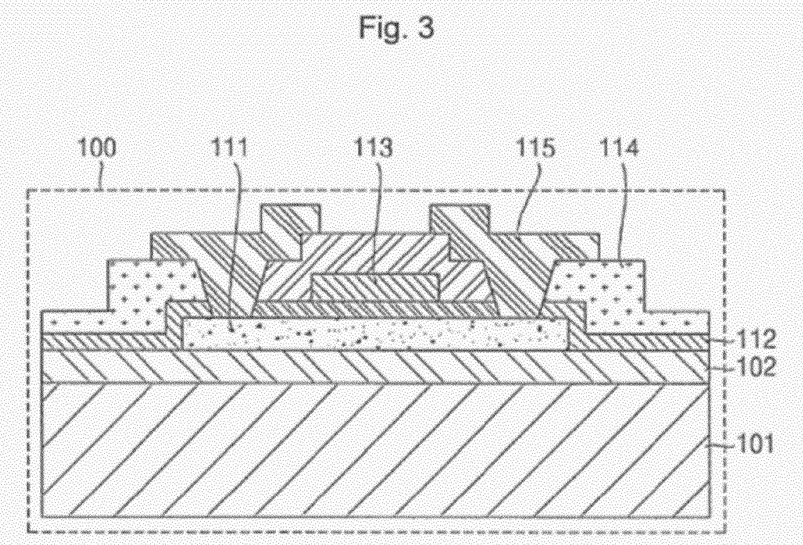
FIG. 3 is a cross-sectional view of a thin film transistor adopting the polycrystalline silicon layer formed according to an aspect of the present invention.

FIG. 3 is a cross-sectional view of a thin film transistor using the polycrystalline silicon layer 110 formed using the SGS crystallization method according to aspects of the present invention. As shown in FIG. 3, the buffer layer 102 is formed on the substrate 101 made of glass, quartz, plastic, or steel. Subsequently, a silicon layer 111 (an active region) is formed by patterning the polycrystalline silicon layer 110 after the polycrystalline silicon layer 110 is formed as described in FIG. 1A to 1F. In the active region 111, the diffusion of the metal catalyst 108c is controlled by removing the unnecessary metal catalyst 108c and the capping layer 104 after the first annealing process 106. Accordingly, the second annealing process 108 is carried out when the number of the seeds 108a for grain growth at the interface 104a is controlled. Therefore, the grain 110a of the polycrystalline silicon layer 110 becomes larger, and the number of the grain boundary 110c becomes smaller. Consequently, even an active region 111 including no grain boundary or at least one grain boundary can be formed.

Subsequently, after a gate insulating layer 112 is formed by forming an insulating layer (such as a silicon oxide film, a silicon nitride film, or any combination thereof) in a single layer or a double layer, a gate electrode 113 is formed by depositing and patterning a gate electrode forming material. As shown, a source/drain region and a channel region (in the active layer 111) can be defined by carrying out an impurity injection process on the silicon layer 111 (an active region) using the gate electrode 113 as a mask. The gate electrode 113 can be any one selected from MoW, Ti, Cu, AlNd, Al, Cr, Mo alloy, Cu alloy, Al alloy, or any combinations thereof.

Subsequently, a contact hole exposing one or more portions of layers is formed by etching a predetermined region of an inter-layer dielectric layer 114 and the gate electrode 113, after the inter-layer dielectric layer 114 is formed by forming an insulating layer (such as a silicon oxide film, a silicon nitride film, or any combinations thereof) in a single layer or a in a double layer on the entire surface of the substrate 101. Then, a thin film transistor 100 is completed as a source/drain electrode (such as 115) is formed by depositing and patterning a source/drain electrode forming material on the entire surface of the substrate 101.

The thin film transistor 100 manufactured by the fabricating method so as to have the structure described above can be used widely as a switching transistor and a driving transistor of a variety of flat panel display devices (such as an active matrix liquid crystal display device and an organic light emitting diode display device). Hereinafter, an organic light emitting diode display device 400 will be described as an example of the flat panel display device equipped with the transistor 100. However, the transistor 100 according to an aspect of the present invention is not limited simply to the organic light emitting diode display device 400.

Figure 4:
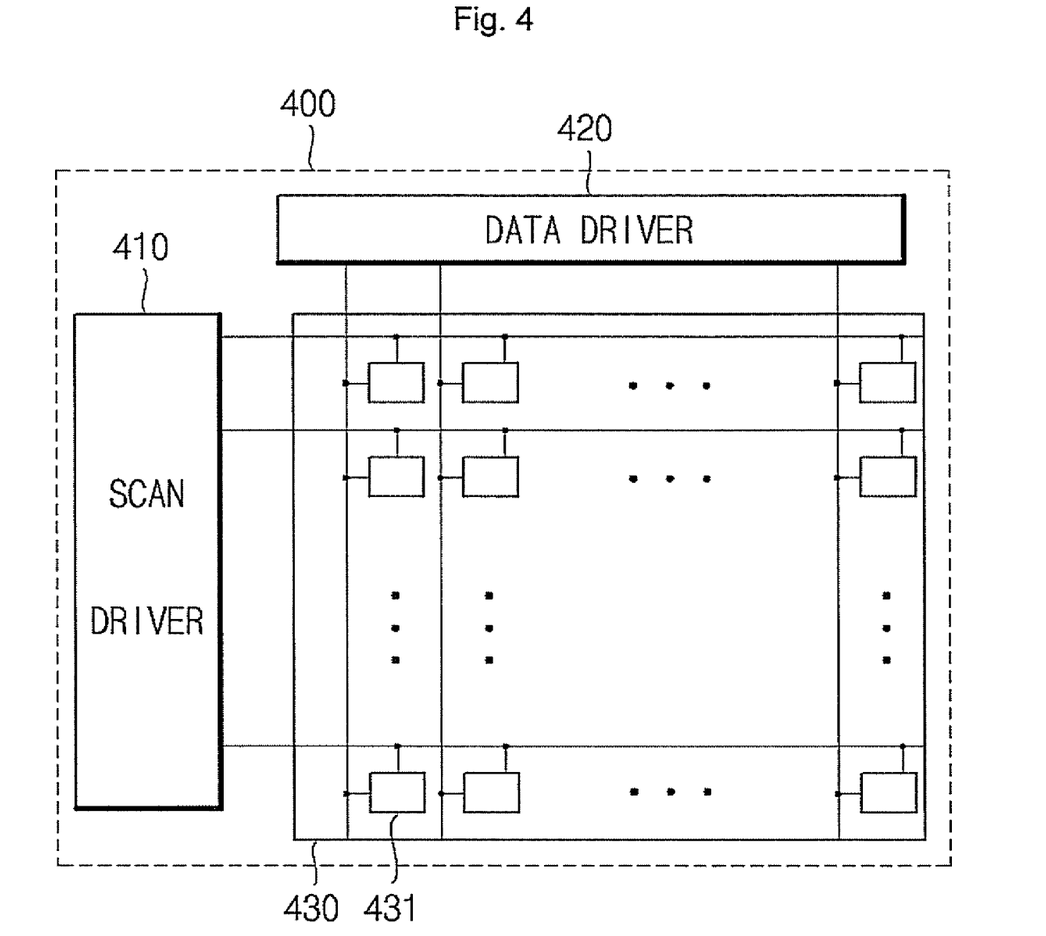
FIG. 4 is a block diagram illustrating an example of a flat panel display device to which the transistor according to an aspect of the present invention can be applied.

Referring to FIG. 4, an active matrix liquid crystal display device is shown as an example of a flat panel display device to which the transistor 100 according to an aspect of the present invention can be applied. As shown in FIG. 4, an organic light emitting diode display device 400 can be integrated and formed including a scan driver 410, a data driver 420, and a pixel portion 430 driven by the scan driver 410 and the data driver 420.

Figure 5:
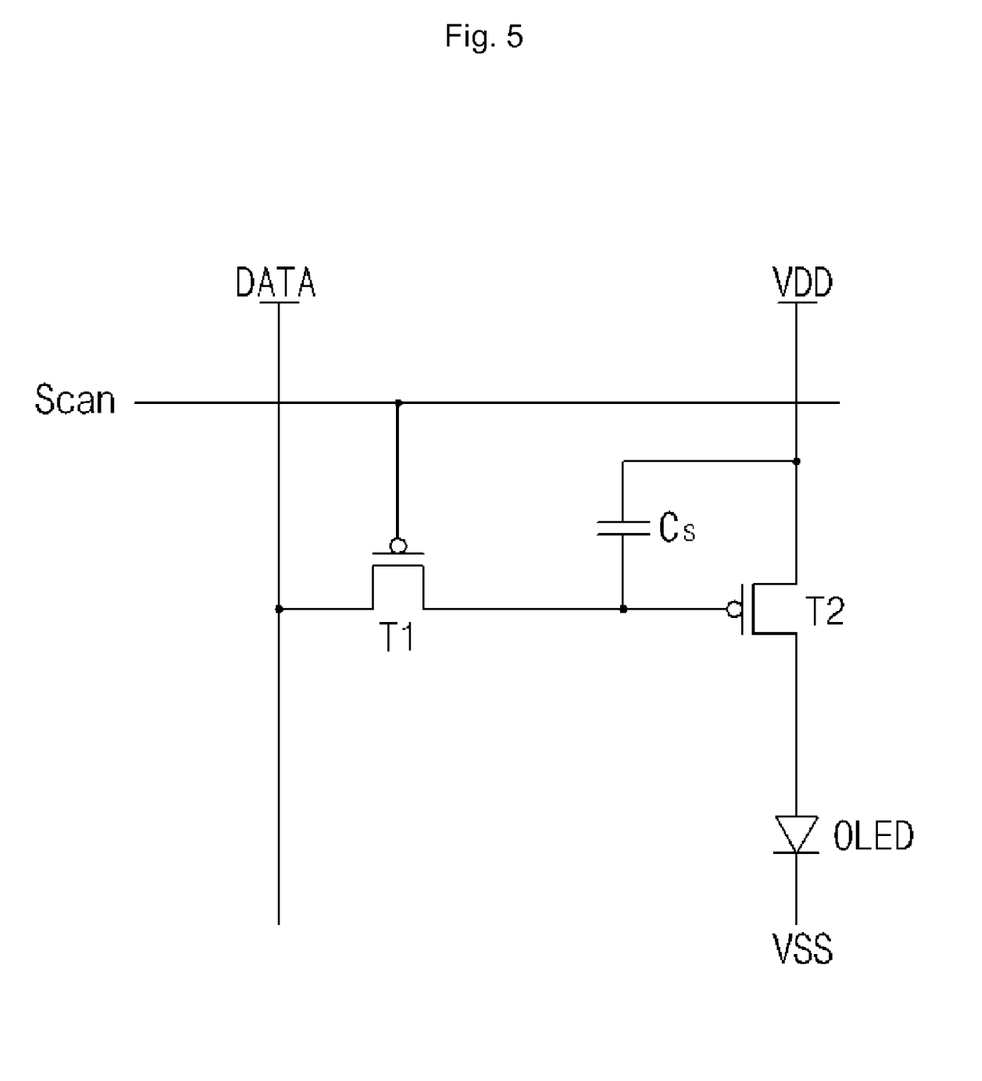
FIG. 5 is an equivalent circuit diagram depicting a pixel circuit of a flat panel display device to which the transistor according to an aspect of the present invention can be applied.

Referring to FIG. 5, a pixel portion or a pixel circuit 430 of a flat panel display device to which the transistor 100 according to an aspect of the present invention can be applied is shown. As shown in FIG. 5, in the pixel circuit 430, a sub-pixel consists of a scan line (Scan) to select which pixel 431 should be driven; a data line (Data) to apply a controlled amount of voltage to the pixel 431 according to a controlled selection; a switching transistor (T1) to control the data flow according to a signal of the scan line (Scan); a power source line (VDD) to supply power; a storage capacitor (Cs) to store an electric charge as much as (or in the amount of) the voltage difference between the voltage applied from the data line (Data) and the voltage supplied from the power source line (VDD); a driving transistor (T2) to send an electric current as an electric current is supplied with (or in the amount of) the voltage stored in the storage capacitor (Cs); and an organic light emitting diode to emit light according to the electric current that flows through the driving transistor (T2).

In addition, the switching transistor (T1) and the driving transistor (T2) are formed with one PMOS thin film transistor respectively, for example. The switching transistor (T1) and the driving transistor (T2) can include more than one PMOS and/or NMOS thin film transistors respectively according to the characteristics of the function desired.

The switching transistor (T1) and the driving transistor (T2) have the same structure as the structure of the transistor 100 according to an aspect of the present invention. A leak (or leakage) current can be reduced by minimizing the concentration of the metal catalyst 108c left in the silicon layer 111 (an active region) of the transistor 100. In addition, a silicon layer 111 of excellent (or improved) crystallinity can be obtained by reducing the unnecessary crystallization by metal catalysts 108c.

Accordingly, the characteristics of a display can be improved by applying the transistor 100 according to aspects of the present invention to a flat panel display device 400 such as an organic light emitting diode display device and a liquid crystal display device.

As described above, the object of the transistor, the fabricating method thereof and the flat panel display device therewith according to aspects of the present invention is to control the concentration of the metal catalyst left in the polycrystalline silicon layer when an amorphous silicon layer is crystallized using the SGS crystallization method. The substrate undergoes the first annealing process by absorbing or diffusing an extremely small amount of the metal catalyst into the capping layer as the substrate undergoes the first annealing process. Then the substrate undergoes the second annealing process after the capping layer and the metal catalyst layer are removed. Consequently, the concentration of the metal catalyst left in the polycrystalline silicon layer can be minimized and a leak (or leakage) current can also be minimized.

The above detailed description is one aspect of the transistor which can prevent or reduce a leak (or a leakage) current, the fabricating process thereof and the flat panel display device therewith according to aspects the present invention, and the aspects of the present invention is not limited to these aspects. It will also be understood that when a layer or element is referred to as being "on" or "over" another layer or substrate, it can be directly on the other layer or substrate, or intervening layers may also be present. Further, it will be understood that when a layer is referred to as being "under" or "below" another layer, it can be directly under, or one or more intervening layers may also be present.

Although a few aspects of the present invention have been shown and described, it would be appreciated by those skilled in the art that changes may be made in the aspects without departing from the principles and spirit of the invention, the scope of which is defined in the claims and their equivalents.

What is claimed is:

1. A method for fabricating a transistor, comprising:
   forming an amorphous silicon layer on a substrate;
   forming a capping layer on the amorphous silicon layer;
   forming a metal catalyst layer on the capping layer;
   performing a first annealing process to crystallize first regions of amorphous silicon of the amorphous silicon layer into first annealed polycrystalline silicon using metal catalysts of the metal catalyst layer that diffused through the capping layer, some of the metal catalysts forming crystallization seeds at an interface of the amorphous silicon layer and the capping layer;
   removing the metal catalyst layer and the capping layer;
   removing the crystallization seeds at the interface; and
   performing a second annealing process to crystallize second regions of amorphous silicon of the amorphous silicon layer into second annealed polycrystalline silicon using the diffused metal catalysts to form a polycrystalline silicon layer comprising the first annealed polycrystalline silicon and the second annealed polycrystalline silicon, wherein the metal catalyst layer and the crystallization seeds are removed after the first annealing process but before the second annealing process.

2. The method of claim 1, further comprising:
   forming a semiconductor layer by patterning the polycrystalline silicon layer; and
   forming a gate insulating layer, a gate electrode, an interlayer dielectric layer, and a source and drain electrode on the substrate.

3. The method of claim 1, wherein during the removing of the metal catalyst layer and the capping layer, the metal catalyst layer and the capping layer are removed once the amorphous silicon is crystallized by the first annealing process so that a respective grain distance is smaller than half of an average distance between the metal catalysts.

4. The method of claim 1, further comprising:
   forming a buffer layer before forming of the amorphous silicon layer on the substrate.

5. The method of claim 1, wherein crystallinity of the first annealed polycrystalline silicon is different from that of the second annealed polycrystalline silicon.

6. The method of claim 1, wherein a grain boundary size of the first annealed polycrystalline silicon is smaller than that of the second annealed polycrystalline silicon.

7. The method of claim 1, wherein the concentration of the metal catalysts of the first annealed polycrystalline silicon is higher than that of the metal catalysts of the second annealed polycrystalline silicon.

8. The method of claim 1, wherein a grain boundary does not exist in the second annealed polycrystalline silicon.

9. The method of claim 1, wherein at least one grain boundary exists in the second annealed polycrystalline silicon.

10. The method of claim 1, wherein the metal catalyst layer is one of Ni, Pd, Ti, Ag, Au, Al, Sn, Sb, Cu, Co, Mo, Tr, Ru, Rh, Cd, Pt, or any combinations thereof.

11. The method of claim 1, wherein the capping layer is an insulating layer.

12. The method of claim 1, wherein the capping layer is one of an oxide film, a nitride film, or any combinations thereof.

13. The method of claim 12, wherein the oxide film is one of silicon dioxide ($SiO_2$), aluminum oxide (alumina, $Al_2O_3$), hafnium oxide ($HfO_2$), zirconium oxide (zirconia, $ZrO_2$), or any combinations thereof.

14. The method of claim 1, wherein the first annealing process occurs between about 500° C. to about 650° C. and the second annealing process occurs between about 550° C. to about 800° C.

15. The method of claim 1, wherein the capping layer is formed directly on the amorphous silicon layer.

16. The method of claim 15, wherein the capping layer comprises a nitride film.

17. The method of claim 16, wherein the metal catalyst layer comprises Ni.

18. The method of claim 17, wherein the capping layer is formed by a chemical vapor deposition method.

* * * * *